United States Patent
Xu et al.

(10) Patent No.: US 9,838,002 B2
(45) Date of Patent: Dec. 5, 2017

(54) IGBT GATE DRIVE DURING TURNOFF TO REDUCE SWITCHING LOSS

(71) Applicant: Ford Global Technologies, LLC, Dearborn, MI (US)

(72) Inventors: Zhuxian Xu, Novi, MI (US); Chingchi Chen, Ann Arbor, MI (US); Xi Lu, Northville, MI (US); Ke Zou, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/132,490

(22) Filed: Apr. 19, 2016

(65) Prior Publication Data
US 2017/0302263 A1   Oct. 19, 2017

(51) Int. Cl.
*H03K 17/284* (2006.01)
*H02M 3/158* (2006.01)
*H03K 17/10* (2006.01)
*B60L 11/18* (2006.01)

(52) U.S. Cl.
CPC ........ *H03K 17/107* (2013.01); *B60L 11/1816* (2013.01); *H02M 3/158* (2013.01); *H03K 17/284* (2013.01)

(58) Field of Classification Search
CPC ....... B60L 11/00; B60L 11/1816; H02M 3/00; H02M 3/158; H03K 17/00; H03K 17/04126; H03K 17/063; H03K 17/0826; H03K 17/107; H03K 17/284; H03K 17/601; H03K 2217/00; H03K 2217/0036
USPC ........................................ 327/109
See application file for complete search history.

(56) References Cited

U.S. PATENT DOCUMENTS

| | | | |
|---|---|---|---|
| 7,768,337 B2 | 8/2010 | Bayerer | |
| 2006/0186933 A1 | 8/2006 | Kimura et al. | |
| 2013/0114317 A1 | 5/2013 | Schlapbach | |
| 2013/0177041 A1* | 7/2013 | Sundaramoorthy | G01R 31/2619 374/178 |
| 2015/0061750 A1 | 3/2015 | Kandah et al. | |
| 2016/0336936 A1* | 11/2016 | Ma | H03K 17/168 |

* cited by examiner

*Primary Examiner* — Lincoln Donovan
*Assistant Examiner* — David Mattison
(74) *Attorney, Agent, or Firm* — David B. Kelley; Brooks Kushman P.C.

(57) ABSTRACT

A vehicle powertrain includes an IGBT and a gate driver. The IGBT is configured to energize an electric machine. The gate driver is configured to apply an off voltage less than a threshold voltage onto a gate of the IGBT while the IGBT is operating in a saturation mode, and in response to expiration of a delay from a transition from saturation to linear mode, apply a voltage pulse above the off voltage to reduce flyback from the electric machine. The gate driver may be configured to, in response to expiration of a delay from a transition from saturation to linear mode, apply a voltage pulse above the off voltage and below the threshold to reduce flyback from the electric machine.

18 Claims, 8 Drawing Sheets

US 9,838,002 B2

IGBT GATE DRIVE DURING TURNOFF TO REDUCE SWITCHING LOSS

TECHNICAL FIELD

This application is generally related to a system and control of a voltage on a gate of an IGBT in a hybrid-electric powertrain during device turnoff to reduce switching loss.

BACKGROUND

Electrified vehicles including hybrid-electric vehicles (HEVs) and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. The traction battery is configured to operate in a particular voltage range. The terminal voltage of a typical traction battery is over 100 Volts DC, and the traction battery is alternatively referred to as a high-voltage battery. However, improved performance of electric machines may be achieved by operating in a different voltage range, typically at higher voltages than the traction battery.

Many electrified vehicles include a DC-DC converter, also referred to as a variable voltage converter (VVC), to convert the voltage of the traction battery to an operational voltage level of the electric machine. The electric machine, that may include a traction motor, may require a high voltage and high current. Due to the voltage, current and switching requirements, an Insulated Gate Bipolar junction Transistor (IGBT) is typically used to generate the signals in the power inverter and the VVC.

SUMMARY

A vehicle powertrain includes an IGBT and a gate driver. The IGBT is configured to energize an electric machine. The gate driver is configured to apply an off voltage less than a threshold voltage onto a gate of the IGBT while the IGBT is operating in a saturation mode, and in response to expiration of a delay from a transition from saturation to linear mode, apply a voltage pulse above the off voltage to reduce flyback from the electric machine.

A method of shutting off an IGBT of a power system includes by a gate driver, reducing a voltage of a gate of the IGBT while operated in a saturation mode to a level below a threshold voltage, and in response to a transition of the IGBT from saturation to linear mode, applying a voltage pulse above the off voltage to reduce switching loss of the IGBT.

A vehicle powertrain includes an IGBT and a gate driver. The IGBT is configured to energize an electric machine. The driver is configured to apply an off voltage onto a gate of the IGBT while the IGBT is operating in a saturation mode, and in response to expiration of a delay from a transition of the IGBT from saturation to linear mode, apply a voltage pulse greater than the off voltage to reduce flyback from the electric machine.

DETAILED DESCRIPTION

Figure 1:
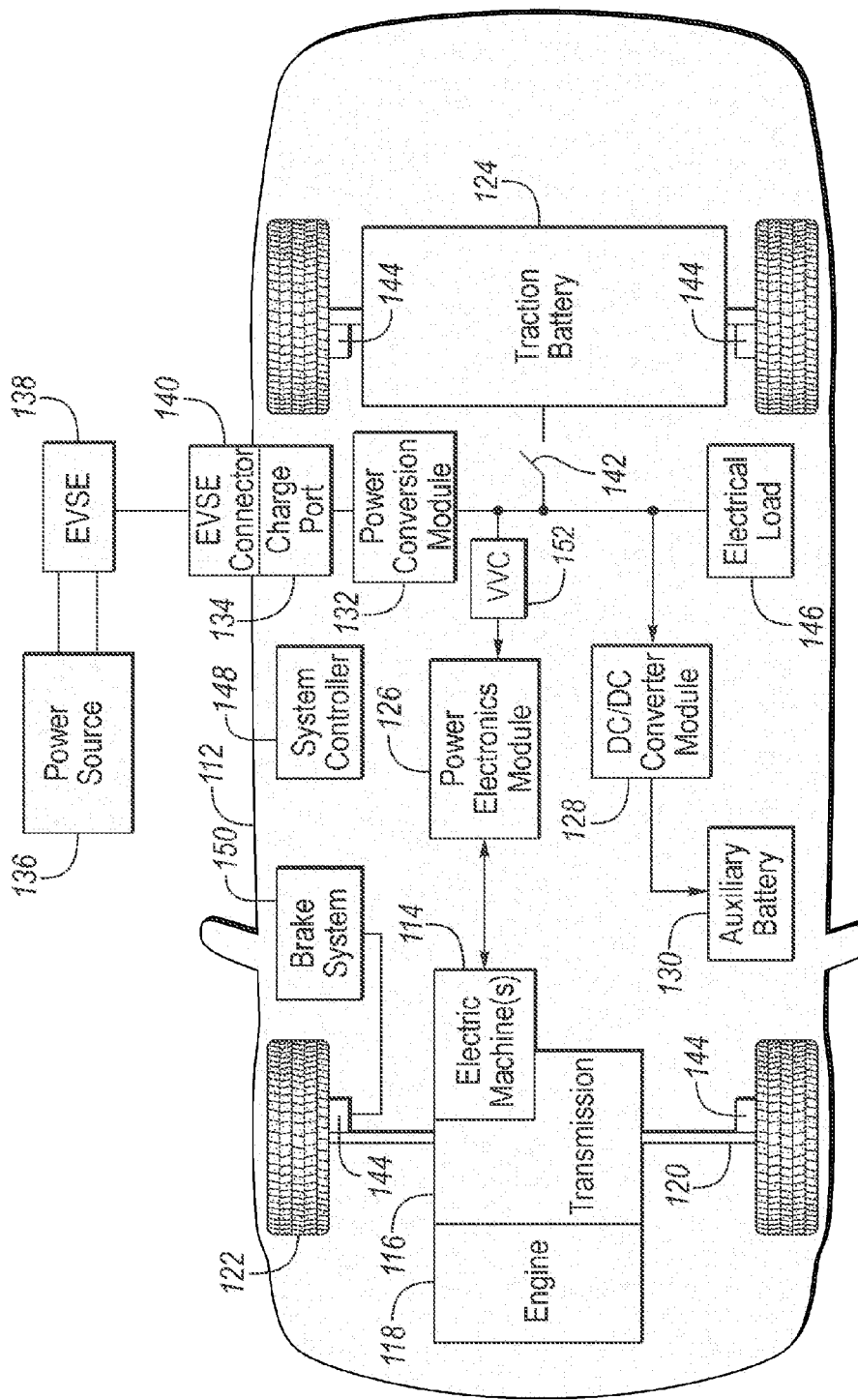
FIG. 1 is a diagram of a hybrid vehicle illustrating typical drivetrain and energy storage components with a variable voltage converter and power inverter therebetween.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Insulated Gate Bipolar junction Transistors (IGBTs) and flyback or freewheeling diodes are widely used in a variety of industrial applications, such as electric motor drives and power inverters. Operation of an IGBT is controlled by a gate voltage supplied by a gate driver. Conventional gate drivers are typically based on a voltage, greater than a threshold voltage, applied to an IGBT gate with a current limiting resistor, which consists of a switchable voltage source and gate resistor. A low gate resistance would lead to a fast switching speed and low switching loss, but also cause higher stresses on the semiconductor devices, e.g. over-voltage stress. Therefore, the gate resistance is selected to seek a compromise between switching loss, switching delay, and stresses. When turning off an IGBT, the gate resistor reduces the current flowing from the gate and thereby increases a shutoff time of the IGBT.

Some disadvantages associated with conventional gate drivers for IGBT turn-on and turnoff include limited control of switching delay time, current slope and voltage slope such that optimization switching losses is limited. Another disadvantage is that a gate resistance is typically selected based on worst case operating condition thus introducing excessive switching losses under normal operating conditions. For example, at a high dc bus voltage, a gate resistance is selected based on a change in current with respect to time (di/dt) in order to avoid excessive diode voltage overshoot during diode fly-back of the load. However, at low dc bus voltage the use of the gate resistance selected to protect for high bus voltages introduces excessive switching losses as a switching speed is then reduced by the gate resistance even though diode over-voltage is below a threshold.

Here, during turnoff of solid state device, such as an IGBT or a Metal Oxide Semiconductor Field Effect Transistor (MOSFET), a voltage pulse is applied to a gate of the solid state device producing a two-stage gate current shutoff waveform. An off-voltage is applied to the gate (Vg) to deplete charge from the gate and shut off the channel formed by the gate voltage. As the enhanced channel is depleted, the solid state device transitions from a saturation mode of operation to a linear mode of operation as the device channel voltage, such as a collector to emitter voltage (Vce) of an IGBT or a drain to source voltage (Vds) of a MOSFET, increases due to linear mode operation. Then, a voltage pulse is applied to the gate of the solid state device to reduce the current flowing from the gate and soften the device turnoff. In another embodiment, the voltage pulse may include a linear voltage ramp such that the gate current is maintained substantially constant during the pulse.

In a conventional gate drive system, the gate drive for an IGBT turn-off is a step function from a turn-on voltage such as 15V to a turn-off voltage such as 0V. A low gate resistance Rg would lead to a fast switching speed and low switching loss, but also cause higher stresses on the semiconductor devices, e.g. over-voltage stress. Therefore, the gate resistance is selected to seek a compromise between switching loss, switching delay, and stresses. Conventional gate drive systems cannot control switching delay time, current slope and voltage slope individually to optimize the switching trajectory.

In the proposed gate drive profile for IGBT turn-off, a saw-tooth waveform is inserted into the Vg profile, which produces a two-stage gate current waveform. A higher Ig is produced at the beginning to increase the voltage Vce rising speed and reduce switching loss. A lower Ig is produced at the later period to lower the current Ic falling rate, which reduces the IGBT over-voltage effectively. Thus, the proposed gate drive profile utilizes the nature of IGBT characteristics and produces two Ig stages to optimize the whole switching trajectory.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
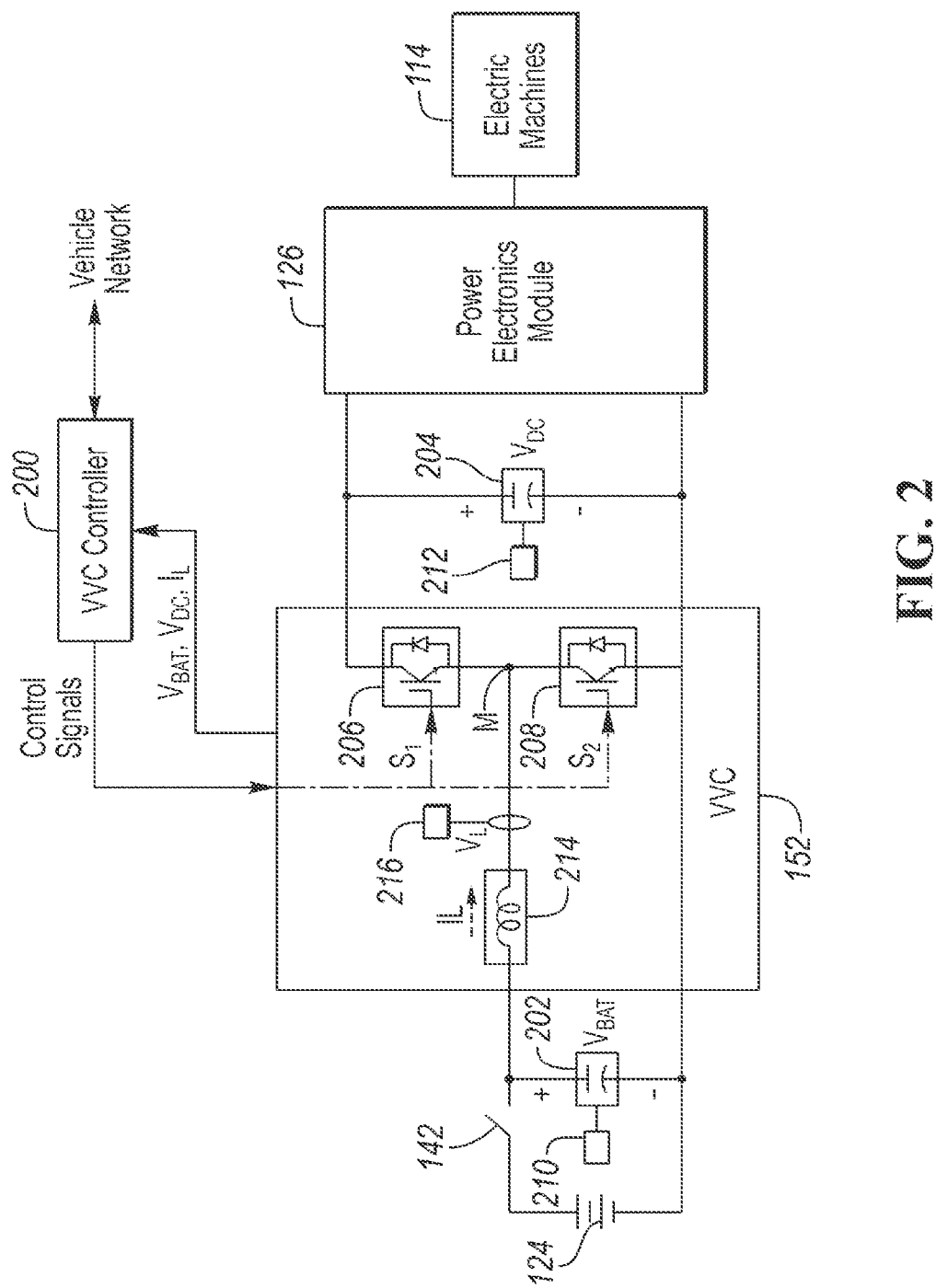
FIG. 2 is a schematic diagram of a vehicular variable voltage converter.

FIG. 2 depicts a diagram of a VVC 152 that is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller 200 that monitors and controls electrical parameters (e.g., voltage and current) at various locations within the VVC 152. In some configurations, the VVC controller 200 may be included as part of the VVC 152. The VVC controller 200 may determine an output voltage reference, $V^*_{dc}$. The VVC controller 200 may determine, based on the electrical parameters and the voltage reference, $V^*_{dc}$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller 200 may command the VVC 152 to provide the desired output voltage using the control signal. The particular control signal at which the VVC 152 is operated may be directly related to the amount of voltage boost to be provided by the VVC 152.

The output voltage of the VVC 152 may be controlled to achieve a desired reference voltage. In some configurations, the VVC 152 may be a boost converter. In a boost converter configuration in which the VVC controller 200 controls the duty cycle, the ideal relationship between the input voltage $V_{in}$ and the output voltage $V_{out}$ and the duty cycle D may be illustrated using the following equation:

$$V_{out} = \frac{V_{in}}{(1-D)} \quad\quad 1)$$

The desired duty cycle, D, may be determined by measuring the input voltage (e.g., traction battery voltage) and setting the output voltage to the reference voltage. The VVC 152 may be a buck converter that reduces the voltage from input to output. In a buck configuration, a different expression relating the input and output voltage to the duty cycle may be derived. In some configurations, the VVC 152 may be a buck-boost converter that may increase or decrease the input voltage. The control strategy described herein is not limited to a particular variable voltage converter topology.

With reference to FIG. 2, the VVC 152 may boost or "step up" the voltage potential of the electrical power provided by the traction battery 124. The traction battery 124 may provide high voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor 202 may be electrically coupled in parallel to the traction battery 124. The input capacitor 202 may stabilize the bus voltage and reduce any voltage and current ripple. The VVC 152 may receive the HV DC power and boost or "step up" the voltage potential of the input voltage according to the duty cycle.

An output capacitor 204 may be electrically coupled between the output terminals of the VVC 152. The output capacitor 204 may stabilize the bus voltage and reduce voltage and current ripple at the output of the VVC 152.

Further with reference to FIG. 2, the VVC 152 may include a first switching device 206 and a second switching device 208 for boosting an input voltage to provide the boosted output voltage. The switching devices 206, 208 may be configured to selectively flow a current to an electrical load (e.g., power electronics module 126 and electric machines 114). Each switching device 206, 208 may be individually controlled by a gate drive circuit (not shown) of the VVC controller 200 and may include any type of controllable switch (e.g., an insulated gate bipolar transistor (IGBT) or field-effect transistor (FET)). The gate drive circuit may provide electrical signals to each of the switching devices 206, 208 that are based on the control signal (e.g., duty cycle of PWM control signal). A diode may be coupled across each of the switching devices 206, 208. The switching devices 206, 208 may each have an associated switching loss. The switching losses are those power losses that occur during state changes of the switching device (e.g., on/off and off/on transitions). The switching losses may be quantified by the current flowing through and the voltage across the switching device 206, 208 during the transition. The switching devices may also have associated conduction losses that occur when the device is switched on.

The vehicle system may include sensors for measuring electrical parameters of the VVC 152. A first voltage sensor 210 may be configured to measure the input voltage, (e.g., voltage of the battery 124), and provide a corresponding input signal ($V_{bat}$) to the VVC controller 200. In one or more embodiments, the first voltage sensor 210 may measure the voltage across the input capacitor 202, which corresponds to the battery voltage. A second voltage sensor 212 may measure the output voltage of the VVC 152 and provide a corresponding input signal ($V_{dc}$) to the VVC controller 200. In one or more embodiments, the second voltage sensor 212 may measure the voltage across the output capacitor 204, which corresponds to the DC bus voltage. The first voltage sensor 210 and the second voltage sensor 212 may include circuitry to scale the voltages to a level appropriate for the VVC controller 200. The VVC controller 200 may include circuitry to filter and digitize the signals from the first voltage sensor 210 and the second voltage sensor 212.

An input inductor 214 may be electrically coupled in series between the traction battery 124 and the switching devices 206, 208. The input inductor 214 may alternate between storing and releasing energy in the VVC 152 to enable the providing of the variable voltages and currents as VVC 152 output, and the achieving of the desired voltage boost. A current sensor 216 may measure the input current through the input inductor 214 and provide a corresponding current signal ($I_L$) to the VVC controller 200. The input current through the input inductor 214 may be a result of the voltage difference between the input and the output voltage of the VVC 152, the conducting time of the switching devices 206, 208, and the inductance L of the input inductor 214. The VVC controller 200 may include circuitry to scale, filter, and digitize the signal from the current sensor 216.

The VVC controller 200 may be programmed to control the output voltage of the VVC 152. The VVC controller 200 may receive input from the VVC 152 and other controllers via the vehicle network, and determine the control signals. The VVC controller 200 may monitor the input signals ($V_{bat}$, $V_{dc}$, $I_L$, $V^*_{dc}$) to determine the control signals. For example, the VVC controller 200 may provide control signals to the gate drive circuit that correspond to a duty cycle command. The gate drive circuit may then control each switching device 206, 208 based on the duty cycle command.

The control signals to the VVC 152 may be configured to drive the switching devices 206, 208 at a particular switching frequency. Within each cycle of the switching frequency, the switching devices 206, 208 may be operated at the specified duty cycle. The duty cycle defines the amount of time that the switching devices 206, 208 are in an on-state and an off-state. For example, a duty cycle of 100% may operate the switching devices 206, 208 in a continuous on-state with no turn off. A duty cycle of 0% may operate the switching devices 206, 208 in a continuous off-state with no turn on. A duty cycle of 50% may operate the switching devices 206, 208 in an on-state for half of the cycle and in an off-state for half of the cycle. The control signals for the two switches 206, 208 may be complementary. That is, the control signal sent to one of the switching devices (e.g., 206) may be an inverted version of the control signal sent to the other switching device (e.g., 208).

The current that is controlled by the switching devices 206, 208 may include a ripple component that has a magnitude that varies with a magnitude of the current, and the duty cycle and switching frequency of the switching devices 206, 208. Relative to the input current, the worst case ripple current magnitude occurs during relatively high input current conditions. When the duty cycle is fixed, an increase in the inductor current causes an increase in magnitude of the ripple current as illustrated in FIG. 4. The magnitude of the ripple current is also related to the duty cycle. The highest magnitude ripple current occurs when the duty cycle equals 50%. The general relationship between the inductor ripple current magnitude and the duty cycle may be as shown in FIG. 5. Based on these facts, it may be beneficial to implement measures to reduce the ripple current magnitude under high current and mid-range duty cycle conditions.

When designing the VVC 152, the switching frequency and the inductance value of the inductor 214 may be selected to satisfy a maximum allowable ripple current magnitude. The ripple component may be a periodic variation that appears on a DC signal. The ripple component may be defined by a ripple component magnitude and a ripple component frequency. The ripple component may have harmonics that are in an audible frequency range that may add to the noise signature of the vehicle. Further, the ripple component may cause difficulties with accurately controlling devices fed by the source. During switching transients, the switching devices 206, 208 may turn off at the maximum inductor current (DC current plus ripple current) which may cause large voltage spike across the switching devices 206, 208. Because of size and cost constraints, the inductance value may be selected based on the conducted current. In general, as current increases the inductance may decrease due to saturation.

The switching frequency may be selected to limit a magnitude of the ripple current component under worst case scenarios (e.g., highest input current and/or duty cycle close to 50% conditions). The switching frequency of the switching devices 206, 208 may be selected to be a frequency (e.g., 10 kHz) that is greater than a switching frequency of the motor/generator inverter (e.g., 5 kHz) that is coupled to an output of the VVC 152. In some applications, the switching frequency of the VVC 152 may be selected to be a predetermined fixed frequency. The predetermined fixed frequency is generally selected to satisfy noise and ripple current specifications. However, the choice of the predetermined fixed frequency may not provide best performance over all operating ranges of the VVC 152. The predetermined fixed frequency may provide best results at a particular set of operating conditions, but may be a compromise at other operating conditions.

Increasing the switching frequency may decrease the ripple current magnitude and lower voltage stress across the switching devices 206, 208, but may lead to higher switching losses. While the switching frequency may be selected for worst case ripple conditions, the VVC 152 may only operate under the worst case ripple conditions for a small percentage of the total operating time. This may lead to unnecessarily high switching losses that may lower fuel economy. In addition, the fixed switching frequency may concentrate the noise spectrum in a very narrow range. The increased noise density in this narrow range may result in noticeable noise, vibration, and harshness (NVH) issues.

The VVC controller 200 may be programmed to vary the switching frequency of the switching devices 206, 208 based on the duty cycle and the input current. The variation in switching frequency may improve fuel economy by reducing switching losses and reduce NVH issues while maintaining ripple current targets under worst case operating conditions.

During relatively high current conditions, the switching devices 206, 208 may experience increased voltage stress. At a maximum operating current of the VVC 152, it may be desired to select a relatively high switching frequency that reduces the ripple component magnitude with a reasonable level of switching losses. The switching frequency may be selected based on the input current magnitude such that as the input current magnitude increases, the switching frequency increases. The switching frequency may be increased up to a predetermined maximum switching frequency. The predetermined maximum switching frequency may be a level that provides a compromise between lower ripple component magnitudes and higher switching losses. The switching frequency may be changed in discrete steps or continuously over the operating current range.

The VVC controller 200 may be programmed to reduce the switching frequency in response to the current input being less than a predetermined maximum current. The predetermined maximum current may be a maximum operating current of the VVC 152. The change in the switching frequency may be based on the magnitude of the current input to the switching devices 206, 208. When the current is greater than the predetermined maximum current, the switching frequency may be set to a predetermined maximum switching frequency. As the current decreases, the magnitude of the ripple component decreases. By operating at lower switching frequencies as the current decreases, switching losses are reduced. The switching frequency may be varied based on the power input to the switching devices. As the input power is a function of the input current and the battery voltage, the input power and input current may be used in a similar manner.

Since the ripple current is also affected by the duty cycle, the switching frequency may be varied based on the duty cycle. The duty cycle may be determined based on a ratio of the input voltage to the output voltage. As such, the switching frequency may also be varied based on the ratio between the input voltage and the output voltage. When the duty cycle is near 50%, the predicted ripple current magnitude is a maximum value and the switching frequency may be set to the predetermined maximum frequency. The predetermined maximum frequency may be a maximum switching frequency value that is selected to minimize the ripple current magnitude. The switching frequency may be changed in discrete steps or continuously over the duty cycle range.

The VVC controller 200 may be programmed to reduce the switching frequency from the predetermined maximum frequency in response to a magnitude of a difference between the duty cycle and the duty cycle value (e.g, 50%) at which the predicted ripple component magnitude is a maximum. When the magnitude of the difference is less than a threshold, the switching frequency may be set to the predetermined frequency. When the magnitude of the difference decreases, the switching frequency may be increased toward the predetermined maximum frequency to reduce the ripple component magnitude. When the magnitude of the difference is less than a threshold, the switching frequency may be set to the predetermined maximum frequency.

The switching frequency may be limited to be between the predetermined maximum frequency and a predetermined minimum frequency. The predetermined minimum frequency may be a frequency level that is greater than a predetermined switching frequency of the power electronic module 126 that is coupled to an output of the variable voltage converter 152. The switching frequency may also be based on parasitic inductance associated with the gate of the IGBT.

Figure 3:
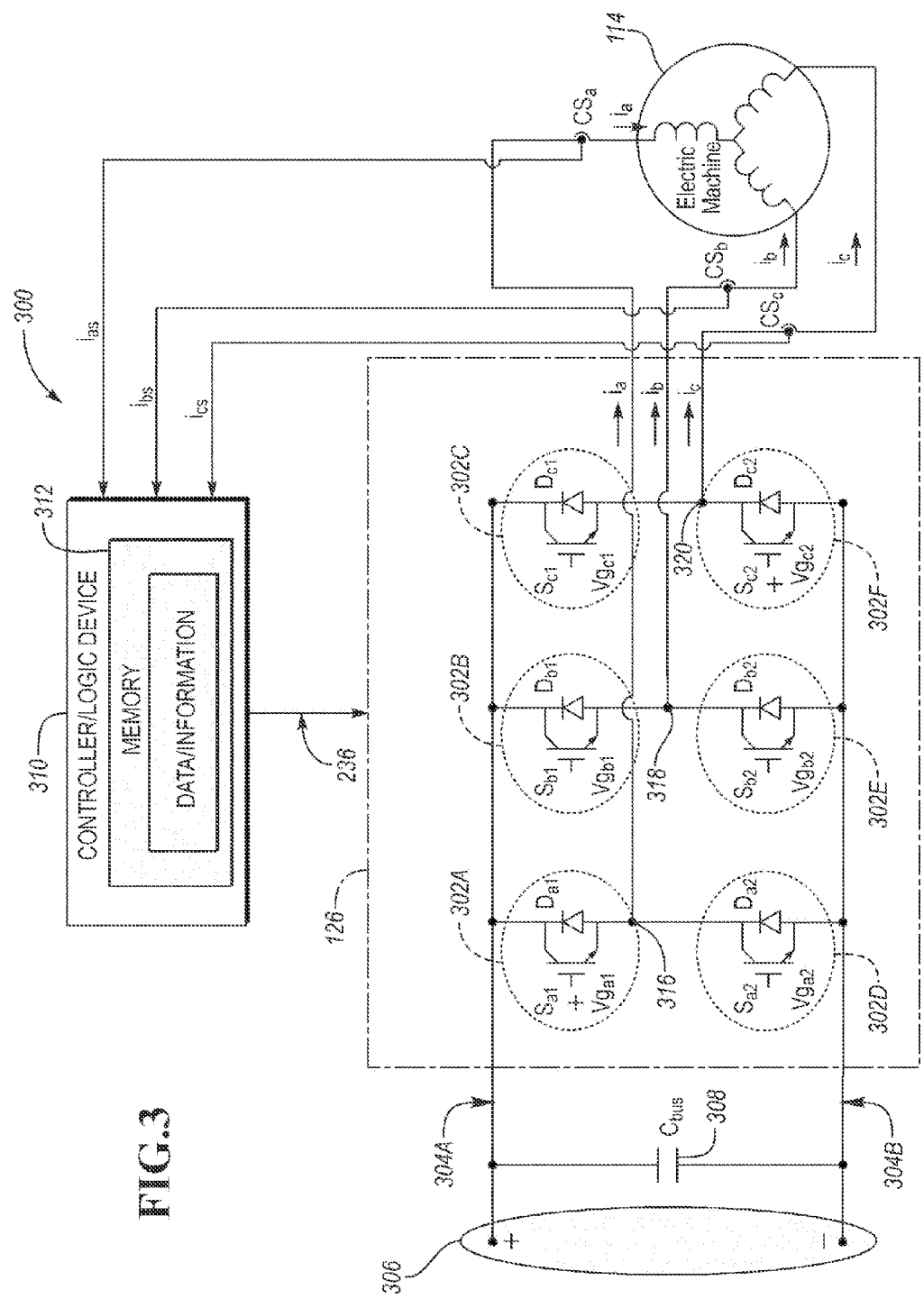
FIG. 3 is a schematic diagram of a vehicular electric machine inverter.

With reference to FIG. 3, a system 300 is provided for controlling a power electronics module (PEM) 126. The PEM 126 of FIG. 3 is shown to include a plurality of switches 302 (e.g., IGBTs) configured to collectively operate as an inverter with first, second, and third phase legs 316, 318, 320. While the inverter is shown as a three-phase converter, the inverter may include additional phase legs. For example, the inverter may be a four-phase converter, a five-phase converter, a six-phase converter, etc. In addition, the PEM 126 may include multiple converters with each inverter in the PEM 126 including three or more phase legs. For example, the system 300 may control two or more inverters in the PEM 126. The PEM 126 may further include a DC to DC converter having high power switches (e.g., IGBTs) to convert a power electronics module input voltage to a power electronics module output voltage via boost, buck or a combination thereof.

As shown in FIG. 3, the inverter may be a DC-to-AC converter. In operation, the DC-to-AC converter receives DC power from a DC power link 306 through a DC bus 304 and converts the DC power to AC power. The AC power is transmitted via the phase currents ia, ib, and ic to drive an AC machine also referred to as an electric machine 114, such as a three-phase permanent-magnet synchronous motor (PMSM) as depicted in FIG. 3. In such an example, the DC power link 306 may include a DC storage battery to provide DC power to the DC bus 304. In another example, the inverter may operate as an AC-to-DC converter that converts AC power from the AC machine 114 (e.g., generator) to DC power, which the DC bus 304 can provide to the DC power link 306. Furthermore, the system 300 may control the PEM 126 in other power electronic topologies.

With continuing reference to FIG. 3, each of the phase legs 316, 318, 320 in the inverter includes power switches 302, which may be implemented by various types of controllable switches. In one embodiment, each power switch 302 may include a diode and a transistor, (e.g., an IGBT). The diodes of FIG. 3 are labeled $D_{a1}$, $D_{a2}$, $D_{b1}$, $D_{b2}$, $D_{c1}$, and $D_{c2}$ while the IGBTs of FIG. 3 are respectively labeled $S_{a1}$, $S_{a2}$, $S_{b1}$, $S_{b2}$, $S_{c1}$, and $S_{c2}$. The power switches $S_{a1}$, $S_{a2}$, $D_{a1}$, and $D_{a2}$ are part of phase leg A of the three-phase converter, which is labeled as the first phase leg A 316 in FIG. 3. Similarly, the power switches $S_{b1}$, $S_{b2}$, $D_{b1}$, and $D_{b2}$ are part of phase leg B 318 and the power switches $S_{c1}$, $S_{c2}$, $D_{c1}$, and $D_{c2}$ are part of phase leg C 320 of the three-phase converter. The inverter may include any number of the power switches 302 or circuit elements depending on the particular configuration of the inverter. The diodes ($D_{xx}$) are connected in parallel with the IGBTs ($S_{xx}$) however, as the polarities are reversed for proper operation, this configuration is often referred to as being connected anti-parallel. A diode in this anti-parallel configuration is also called a freewheeling diode.

As illustrated in FIG. 3, current sensors $CS_a$, $CS_b$, and $CS_c$ are provided to sense current flow in the respective phase legs 316, 318, 320. FIG. 3 shows the current sensors $CS_a$, $CS_b$, and $CS_c$ separate from the PEM 126. However, current sensors $CS_a$, $CS_b$, and $CS_c$ may be integrated as part of the PEM 126 depending on its configuration. Current sensors $CS_a$, $CS_b$, and $CS_c$ of FIG. 3 are installed in series with each of phase legs A, B and C (i.e., phase legs 316, 318, 320 in FIG. 3) and provide the respective feedback signals $i_{as}$, $i_{bs}$, and $i_{cs}$ (also illustrated in FIG. 3) for the system 300. The feedback signals $i_{as}$, $i_{bs}$, and $i_{cs}$ may be raw current signals processed by logic device (LD) 310 or may be embedded or encoded with data or information about the current flow through the respective phase legs 316, 318, 320. Also, the power switches 302 (e.g., IGBTs) may include current sensing capability. The current sensing capability may include being configured with a current mirror output, which may provide data/signals representative of $i_{as}$, $i_{bs}$, and $i_{cs}$. The data/signals may indicate a direction of current flow, a magnitude of current flow, or both the direction and magnitude of current flow through the respective phase legs A, B, and C.

Referring again to FIG. 3, the system 300 includes a logic device (LD) or controller 310. The controller or LD 310 can be implemented by various types or combinations of electronic devices and/or microprocessor-based computers or controllers. To implement a method of controlling the PEM 126, the controller 310 may execute a computer program or algorithm embedded or encoded with the method and stored in volatile and/or persistent memory 312. Alternatively, logic may be encoded in discrete logic, a microprocessor, a microcontroller, or a logic or gate array stored on one or more integrated circuit chips. As shown in the embodiment of FIG. 3, the controller 310 receives and processes the feedback signals $i_{as}$, $i_{bs}$, and $i_{cs}$ to control the phase currents $i_a$, $i_b$, and $i_c$ such that the phase currents $i_a$, $i_b$, and $i_c$ flow through the phase legs 316, 318, 320 and into the respective windings of the electric machine 114 according to various current or voltage patterns. For example, current patterns can include patterns of phase currents $i_a$, $i_b$, and $i_c$ flowing into and away from the DC-bus 304 or a DC-bus capacitor 308. The DC-bus capacitor 308 of FIG. 3 is shown separate from the PEM 126. However, the DC-bus capacitor 308 may be integrated as part of the PEM 126.

As shown in FIG. 3, a storage medium 312 (hereinafter "memory"), such as computer-readable memory may store the computer program or algorithm embedded or encoded with the method. In addition, the memory 312 may store data or information about the various operating conditions or components in the PEM 126. For example, the memory 312 may store data or information about current flow through the respective phase legs 316, 318, 320. The memory 312 can be part of the controller 310 as shown in FIG. 3. However, the memory 312 may be positioned in any suitable location accessible by the controller 310.

As illustrated in FIG. 3, the controller 310 transmits at least one control signal 236 to the power converter system 126. The power converter system 126 receives the control signal 322 to control the switching configuration of the inverter and therefore the current flow through the respective phase legs 316, 318, and 320. The switching configuration is a set of switching states of the power switches 302 in the inverter. In general, the switching configuration of the inverter determines how the inverter converts power between the DC power link 306 and the electric machine 114.

To control the switching configuration of the inverter, the inverter changes the switching state of each power switch 302 in the inverter to either an ON state or an OFF state based on the control signal 322. In the illustrated embodiment, to switch the power switch 302 to either ON or OFF states, the controller/LD 310 provides the gate voltage (Vg) to each power switch 302 and therefore drives the switching state of each power switch 302. Gate voltages $Vg_{a1}$, $Vg_{a2}$, $Vg_{b1}$, $Vg_{b2}$, $Vg_{c1}$, and $Vg_{c2}$ (shown in FIG. 3) control the switching state and characteristics of the respective power switches 302. While the inverter is shown as a voltage-driven device in FIG. 3, the inverter may be a current-driven device or controlled by other strategies that switch the power switch 302 between ON and OFF states. The controller 310 may change the gate drive for each IGBT based on the rotational speed of the electric machine 114, the mirror current, or a temperature of the IGBT switch. The change in gate drive may be selected from a plurality of gate drive currents in which the change gate drive current is proportional to a change in IGBT switching speed.

As also shown in FIG. 3, each phase leg 316, 318, and 320 includes two switches 302. However, only one switch in each of the legs 316, 318, 320 can be in the ON state without shorting the DC power link 306. Thus, in each phase leg, the switching state of the lower switch is typically opposite the switching state of the corresponding upper switch. Consequently, a HIGH state of a phase leg refers to the upper switch in the leg in the ON state with the lower switch in the OFF state. Likewise, a LOW state of the phase leg refers to the upper switch in the leg in the OFF state with the lower switch in the ON state. As a result, IGBTs with current mirror capability may be on all IGBTs, a subset of IGBTs (e.g., $S_{a1}$, $S_{b1}$, $S_{c1}$) or a single IGBT.

Two situations can occur during an active state of the three-phase converter example illustrated in FIG. 2: (1) two phase legs are in the HIGH state while the third phase leg is in the LOW state, or (2) one phase leg is in the HIGH state while the other two phase legs are in the LOW state. Thus, one phase leg in the three-phase converter, which may be defined as the "reference" phase for a specific active state of the inverter, is in a state opposite to the other two phase legs, or "non-reference" phases, that have the same state. Consequently, the non-reference phases are either both in the HIGH state or both in the LOW state during an active state of the inverter.

Figure 4A:
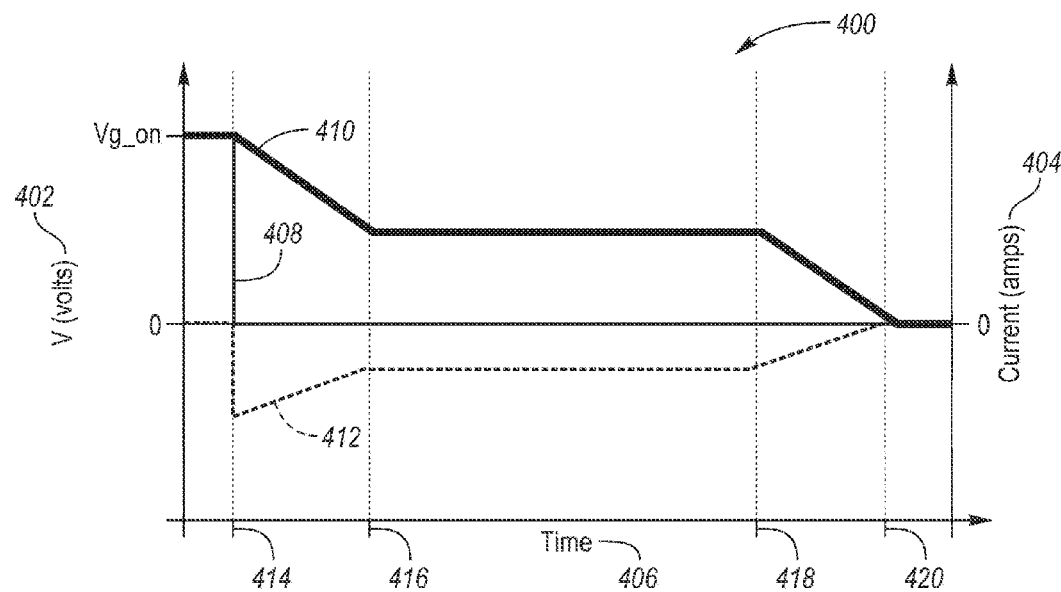
FIGS. 4A and 4B are graphical representations of gate voltages and currents with respect to time.
Figure 5:
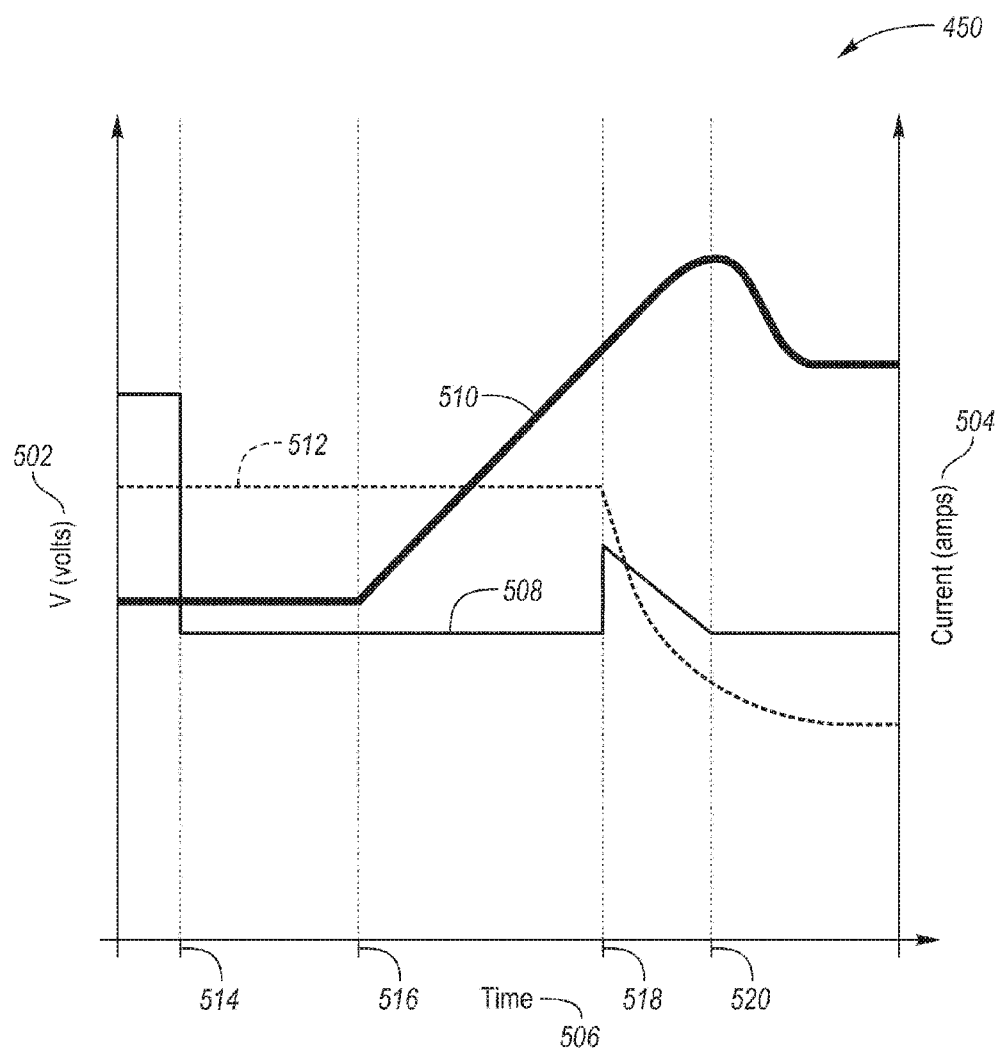
FIG. 5 is a graphical representation of a gate voltage, a voltage across the collector and emitter, and a collector current with respect to time.

FIG. 4A is a graphical representation 400 of gate voltages (Vg and Vge) and a gate current with respect to time. Here, gate voltages are measured in volts 402 and gate current is measured in amps 404. Both gate voltages and gate current is shown in relation to time 406. A conventional gate voltage (Vg) profile 408 is shown along with a profile of a conventional gate voltage measured between the emitter and the gate (Vge) 410 and a gate current (Ig) profile 412. At time 414, an off voltage is applied to the gate of the IGBT. The off voltage is a voltage less than a threshold voltage of the IGBT, and typically the off voltage is 0 volts DC or substantially at 0 volts. In this illustration, the IGBT was conducting in a saturation mode prior to the application of an off voltage at time 414. When the off voltage is applied, the gate to emitter voltage (Vge) profile 410 decreases at a substantially linear rate from the steady state on voltage at time 414 to a time 416 at which the miller plateau is reached. The profile maintains a substantially constant voltage from time 416 to time 418 due to the miller effect at the miller plateau. The gate to emitter voltage will continue to decrease at a linear rate after the effect of the miller plateau at time 418 until the charge is depleted from the gate of the IGBT at time 420.

Figure 4B:
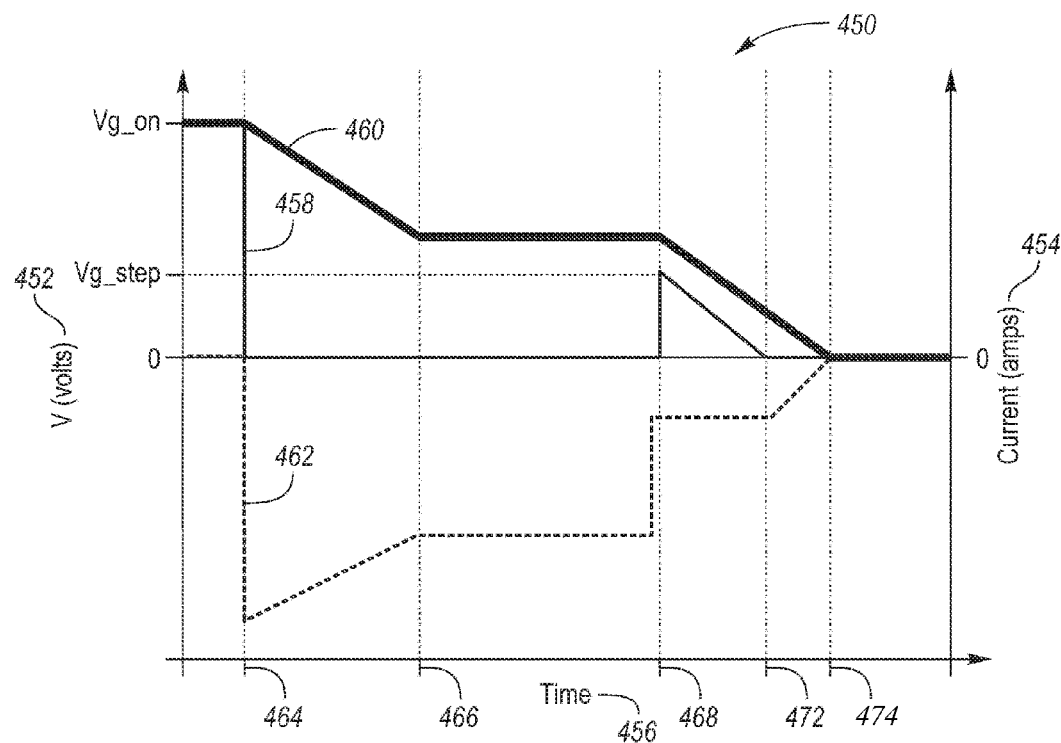

FIG. 4B is a graphical representation 450 of gate voltages (Vg and Vge) and a gate current with respect to time. Here, gate voltages are measured in volts 452 and gate current is measured in amps 454. Both gate voltages and gate current is shown in relation to time 456. A proposed gate voltage (Vg) profile 458 is shown along with a profile of a conventional gate voltage measured between the emitter and the gate (Vge) 460 and a gate current (Ig) profile 462. Here an off voltage is applied at time 464 that results in the gate to emitter voltage reaching the miller plateau at time 466. At time 468, a voltage pulse is applied to the gate of the IGBT to reduce the gate current level. In this example, the voltage pulse is shown as a voltage impulse having a linear decreasing tail until time 472. The linear decreasing profile results in a substantially constant gate current after which, the voltage will resume the decrease. Here, a goal of the additional voltage pulse is to maintain the period 468-474 as compared with the conventional period of 418-420, while shortening the period 464-468 as compared with the conventional period 414-418.

The amplitude of the gate current Ig from time 468 to 472 (Ig_low) determines a current decreasing slope and the IGBT voltage spike. The higher the absolute value of Ig_low is, the higher the voltage spike is. Ig_low is selected so that the IGBT voltage spike does not exceed a safety limit under the worst operating conditions of the system (e.g. high dc bus voltage, high load current, low device junction temperature). In one embodiment, Vg_step=Vg_threshold−Ig*Rg. In which Vg_threshold is the IGBT threshold voltage, Ig is the gate current such as Ig_low, and Rg is the gate resistance. Generally speaking, the Vg decay slope is the same as the Vge decay slope in order to produce a constant Ig. The slope (dVg/dt) is roughly Ig_low/Cies in which Cies is the device input capacitance measured between the gate and emitter terminals with the collector shorted to the emitter.

FIG. 5 is a graphical representation 450 of a gate voltage (Vg) 508, a voltage across the collector and emitter (Vce) 510, and a collector current (Ic) 512 shown with respect to time 506. Vg 508 and Vce 510 are expressed in volts 502, while Ig is expressed in current (Amps) 504. An off voltage is applied at time 514 that results in the collector to emitter voltage (Vce) increasing at time 516. Prior to the increasing at time 516, The IGBT is operated in a saturation mode and the Vce is equal to the saturation voltage. At time 516, the IGBT transitions from operation in the saturation mode to operation in a linear mode. After a predetermined delay from the transition time 516, a voltage pulse is applied to the gate of the IGBT. The predetermined delay is shown as the difference between time 518 and time 516. The collector current is shown substantially constant until time 518 after which the collector current decreases because Vce exceeds the DC bus voltage due to the voltage pulse applied to the gate of the IGBT. In this example, the voltage pulse is shown as a voltage impulse having a linear decreasing tail until time 520. However, the pulse may be other forms including a rectangular pulse, a triangular pulse, a sawtooth pulse, or an impulse.

Figures 6A, 6B:
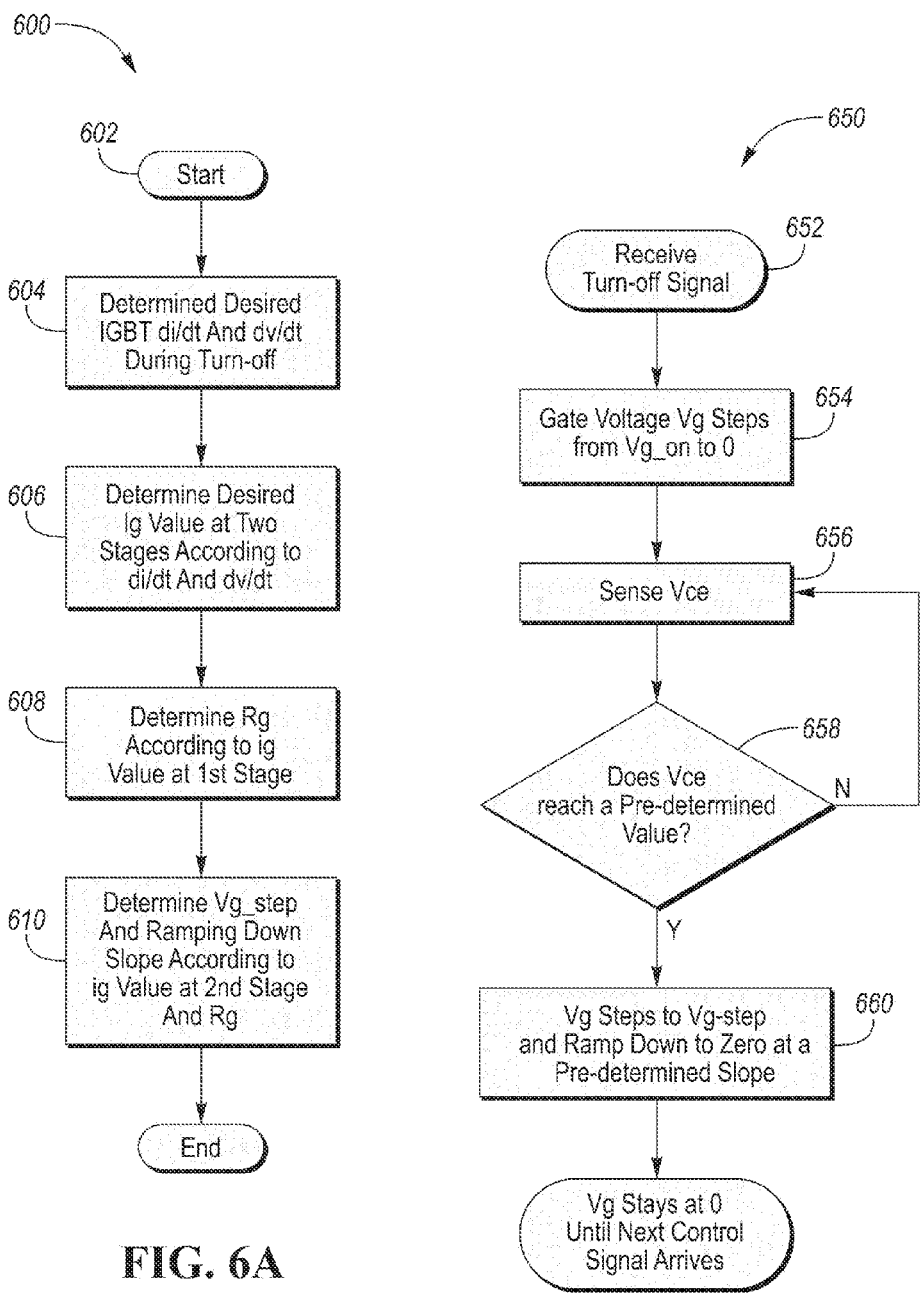
FIGS. 6A and 6B are flow diagrams of methods to drive a gate of an IGBT to reduce switching loss at shutoff.

FIG. 6A is a flow diagram 600 of a method to drive a gate of an IGBT to reduce switching loss at during shutoff. In operation 602, a controller receives a signal to shut off an IGBT device. This flow diagram 600 is beneficial in selection of the parameters. For example, in operation 604, the controller calculates a desired change in current (Ic) with respect to time and a desired change in voltage (Vce) with respect to time during turn-off.

In operation 606, the controller calculates the desired gate current (Ig) during two stages of operation of the IGBT. The first stage is the period from time 466 to time 468 and the second stage is the period from time 468 to time 472.

In operation 608, the controller calculates a gate resistance that is determined according to a gate current during the first stage.

In operation 610, the controller calculates the Vg_step and ramp down slope is determined according to the $2^{nd}$ stage and the gate resistance from operation 608.

FIG. 6B is a flow diagram 650 of method to drive a gate of an IGBT to reduce switching loss during IGBT shutoff. This flow diagram 650 is beneficial during run-time of the vehicle powertrain. In operation 652, a controller receives a signal to shut off an IGBT device. In operation 654, the controller reduces the voltage across the gate and emitter of the IGBT from a Vg_on level to an off level. The Vg_on level is a level greater than the threshold voltage of the IGBT (Vth) and is typically 15V. The off level is a voltage level less than the threshold voltage and is typically 0 volts.

In operation 656, a voltage across the collector and emitter (Vce) of the IGBT is measured. Similarly for IGBTs used in a power inverter, a voltage across a phase leg of an electric machine may be monitored or in a DC-DC converter, a voltage level at the inductor node labeled "M" in FIG. 2 may be monitored.

In operation 658, the controller compares if the voltage measured in operation 656 is greater than a predetermined value. For example, when an IGBT is being operated, often the IGBT is turned on and operated in a saturation mode such that the voltage across the collector and emitter is in a saturation mode. When the IGBT is in saturation mode, the collector to emitter voltage is low in comparison with the linear mode operating collector to emitter voltage. Here, the voltage is monitored to detect when the IGBT is transitioning from saturation mode to linear mode. The increase in Vce is indicative of a transition from saturation to linear mode, however, other conditions also may result in an increase in Vce, for example, an increase in IGBT temperature will typically increase the voltage. If the voltage does not exceed the threshold, the controller will continue to monitor the voltage in operation 656. If the voltage exceeds the threshold, the controller will branch to operation 660.

In operation 660, the controller applies a voltage pulse to the gate of the IGBT, at a level above the threshold voltage. The pulse is then gradually ramped down to 0 volts. In this example, the pulse is saw tooth pulse, however, the pulse may also be an impulse, a square wave pulse, a rectangular pulse, a triangular pulse, a sine pulse, or other pulse waveform. Here, the use of a sawtooth waveform as shown in FIG. 4B illustrates the reduction of the gate current and substantially maintaining the gate current based on the sawtooth pulse.

After the level of the pulse returns to the off-state such as zero volts, the gate voltage Vg will remain off until the next on signal arrives.

Figure 7:
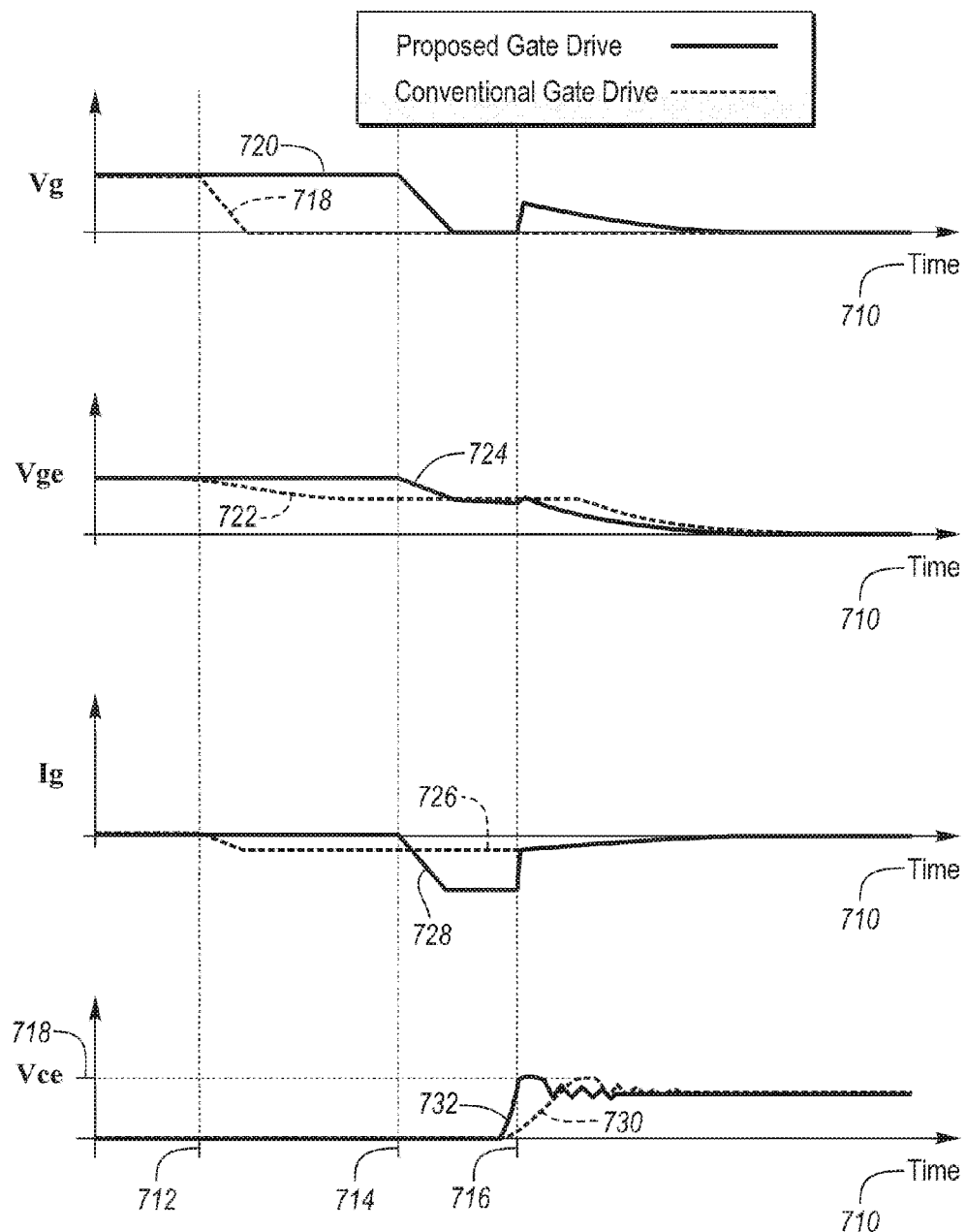
FIG. 7 is a graphical representation of IGBT operating characteristics with respect to time.

FIG. 7 is a graphical representation of IGBT operating characteristics with respect to time 710. Here, the operating characteristics include a gate voltage applied to a gate resistor (Vg), a profiles of a voltage across the gate and emitter of the IGBT (Vge), a profile of a current associated with a gate of the IGBT (Ig), and a voltage across the collector and emitter of the IGBT (Vce). This graphical representation compares two gate drive systems, a conventional gate drive and a proposed gate drive including a voltage pulse during device shut-off. The profiles are aligned based on turn-off in which the conventional gate drive requires a longer turn-off time as illustrated by the time between a beginning of the conventional gate drive turn-off time 712, and a beginning of the proposed gate drive turn-off time 714. The alignment is when the in both profiles, the Vce begins to increase from the saturation voltage as shown slightly before time pulse is applied at time 716. Here, a delay is inserted between the time Vce increases indicative of a transition from saturation to linear operation to the time the pulse is drive 716. However, in other embodiments the pulse may be applied when Vce transitions. Two Vg profiles are shown, a Vg profile of a conventional gate drive 718 and a Vg profile including a voltage pulse applied during device turn-off 720. An advantage of the Vg profile including the voltage pulse applied during device turn-off includes a reduction in a turn-off time. The reduction in turn off time is illustrated by a difference in time of the a conventional gate drive initiates an IGBT turn-off at time 712, and a time the proposed gate drive initiates an IGBT turn-off at time 714.

Based on the gate resistance and the time the conventional gate drive initiates IGBT turn-off at time 712, the gate voltage across the gate and emitter (Vge) is shown to begin dropping after time 712. While the time the proposed gate drive initiates IGBT turn-off at time 714, the gate voltage across the gate and emitter (Vge) is shown to drop after time 712 as illustrated by profile Two Vge profiles are shown, a Vge profile of a conventional gate drive 722 and a Vge profile including a voltage pulse applied during device turn-off 724. The increased gate resistance of the conventional gate drive system results in greater switching loss during turn-off. Likewise, Two Ig profiles are shown, an Ig profile of a conventional gate drive 726 and an Ig profile including a voltage pulse applied during device turn-off 728. Due to the reduced gate resistance of the proposed gate drive system, the negative gate current is greater thus allowing the proposed gate drive system to have a lower switching loss during turn-off.

Two Vce profiles are shown, a Vce profile of a conventional gate drive 730 and a Vce profile including a voltage pulse applied to the gate during device turn-off 732. Here, the faster transition from saturation to off is illustrated in which the pulse reduces the overshoot thus reducing switching loss during turn-off.

Figure 8A:
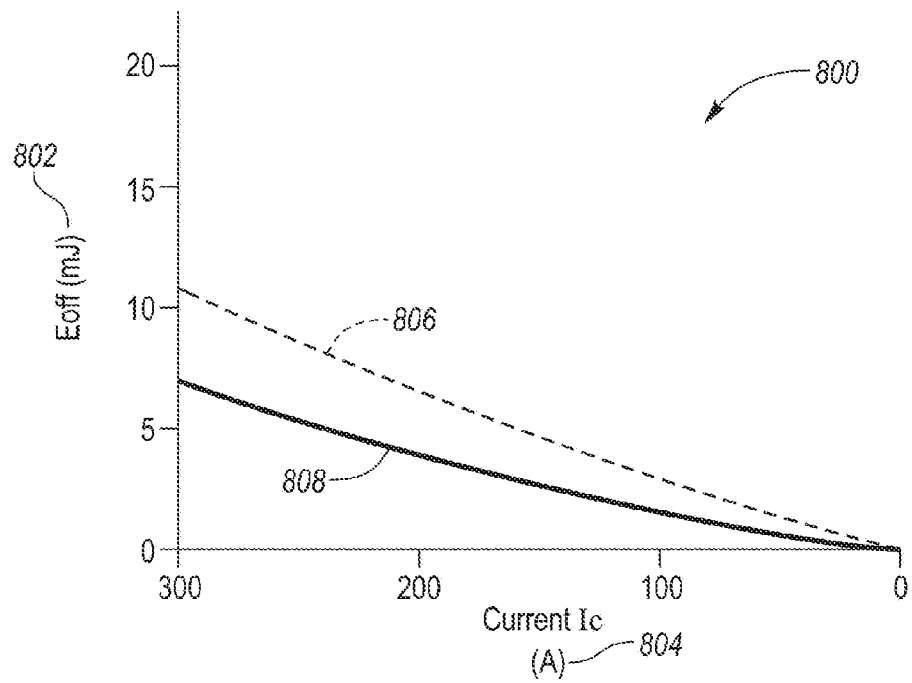
FIGS. 8A and 8B are graphical representations of IGBT turnoff loss with respect to collector current.
Figure 8B:
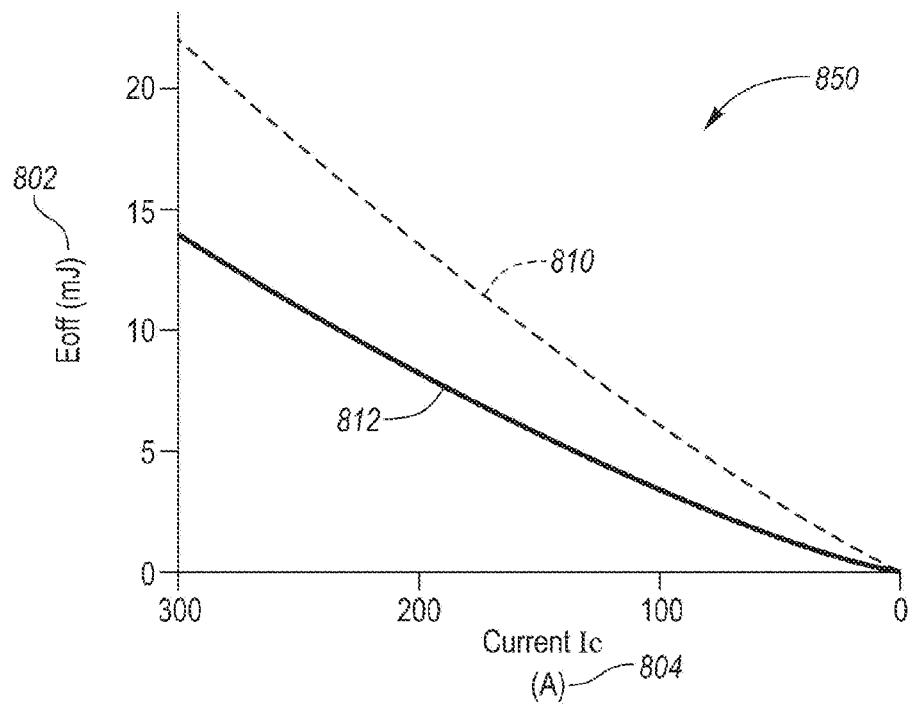

FIGS. 8A and 8B are graphical representations of IGBT turnoff loss with respect to collector current. The loss reduction of the proposed gate drive system in an IGBT under a variety of operating conditions, including different current and voltage levels has been shown to be reduced by 35% to 60%.

In FIG. 8A, the graphical representation 800 of energy loss 802 displayed in millijoules (mJ) in relation to collector current (Ic) 804 is shown for a system operating with a Vce of 200V. Here energy loss for a convention gate drive system profile 806 is illustrated with a proposed gate drive system energy loss profile 808. When Vce is 200V and the current is 300 Amps, the graph illustrates that a reduction in energy loss is approximately 35% that decreases as Ic decreases.

In FIG. 8B, the graphical representation 850 of energy loss 802 displayed in millijoules (mJ) in relation to collector current (Ic) 804 is shown for a system operating with a Vce of 400V. Here energy loss for a convention gate drive system profile 810 is illustrated with a proposed gate drive system energy loss profile 812. When Vce is 400V and the current is 300 Amps, the graph illustrates that a reduction in energy loss is approximately 35% that decreases as Ic decreases.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle powertrain comprising:
an IGBT configured to energize an electric machine; and
a gate driver configured to apply an off voltage less than a threshold voltage onto a gate of the IGBT while the IGBT is operating in a saturation mode, and to apply a voltage pulse above the off voltage that is triggered by expiration of a predetermined delay time initiated with transition from saturation to linear mode.

2. The vehicle powertrain of claim 1, wherein the gate driver is further configured to apply the voltage pulse at a voltage level based on a parasitic inductance of the IGBT.

3. The vehicle powertrain of claim 1, wherein the IGBT energizes the electric machine based on a DC bus voltage, and the predetermined delay time is based on the DC bus voltage, a gate current, and an input capacitance of the IGBT measured between the gate and emitter of the IGBT with a collector of the IGBT shorted to the emitter.

4. The vehicle powertrain of claim 1, wherein a maximum amplitude of the voltage pulse is the threshold voltage of the IGBT.

5. The vehicle powertrain of claim 1, wherein a maximum amplitude of the voltage pulse is based on a temperature of the IGBT, a DC bus voltage, and a maximum current to energize the electric machine.

6. The vehicle powertrain of claim 5, wherein the voltage pulse is a sawtooth pulse having a negative slope from the maximum amplitude to the off voltage.

7. The vehicle powertrain of claim 6, wherein the negative slope of the voltage pulse is based on a gate current and an input capacitance of the IGBT measured between the gate and emitter of the IGBT with a collector of the IGBT shorted to the emitter.

8. A method of shutting off an IGBT of a power system comprising:
by a gate driver, reducing a voltage of a gate of the IGBT while operated in a saturation mode to a level below a threshold voltage; and
applying a voltage pulse above the off voltage that is triggered by expiration of a predetermined delay time initiated with transition of the IGBT from saturation to linear mode to reduce switching loss of the IGBT.

9. The method of claim 8, wherein a maximum amplitude of the voltage pulse is the threshold voltage of the IGBT.

10. The method of claim 8, wherein the predetermined delay time is based on a DC bus voltage, a gate current, and an input capacitance of the IGBT measured between the gate and emitter of the IGBT with a collector of the IGBT shorted to the emitter.

11. A vehicle powertrain DC-DC converter comprising:
an IGBT configured to energize an inductor; and
a gate driver configured to apply an off voltage onto a gate of the IGBT while the IGBT is operating in a saturation mode, and to apply a voltage pulse above the off voltage that is triggered by expiration of a predetermined delay time initiated with transition of the IGBT from saturation to linear mode.

12. The vehicle powertrain DC-DC converter of claim 11, wherein the gate driver is further configured to apply the voltage pulse at a voltage level based on a parasitic inductance of the IGBT.

13. The vehicle powertrain DC-DC converter of claim 11, wherein the IGBT energizes the inductor based on a DC bus voltage, and the predetermined delay time is based on the DC bus voltage, a gate current, and an input capacitance of the IGBT measured between the gate and emitter of the IGBT with a collector of the IGBT shorted to the emitter.

14. The vehicle powertrain DC-DC converter of claim 11, wherein a maximum amplitude of the voltage pulse is a threshold voltage of the IGBT.

15. The vehicle powertrain DC-DC converter of claim 11, wherein the off voltage is less than a threshold voltage of the IGBT.

16. The vehicle powertrain DC-DC converter of claim 11, wherein a maximum amplitude of the voltage pulse is based on a temperature of the IGBT, a DC bus voltage, and a maximum current to energize the inductor.

17. The vehicle powertrain DC-DC converter of claim 16, wherein the voltage pulse is a sawtooth pulse having a negative slope from the maximum amplitude to the off voltage.

18. The vehicle powertrain DC-DC converter of claim 17, wherein the negative slope of the voltage pulse is based on a gate current and an input capacitance of the IGBT measured between the gate and emitter of the IGBT with a collector of the IGBT shorted to the emitter.

* * * * *